United States Patent [19]

Meyer et al.

[11] Patent Number: 5,391,997
[45] Date of Patent: Feb. 21, 1995

[54] OPTICALLY ISOLATED N-CHANNEL MOSFET DRIVER

[75] Inventors: Brian D. Meyer, Scottsdale; David M. Heminger, Mesa; Joseph H. Slaughter, III, Chandler, all of Ariz.

[73] Assignee: Motorola, Inc., Schaumburg, Ill.

[21] Appl. No.: 141,366

[22] Filed: Oct. 28, 1993

[51] Int. Cl.⁶ .................... G02B 27/00; H03K 19/14
[52] U.S. Cl. .................... 327/514; 327/515; 327/455; 327/440
[58] Field of Search ............... 307/311, 632, 633, 637, 307/300; 250/511

[56] References Cited

U.S. PATENT DOCUMENTS

| | | | |
|---|---|---|---|
| 4,665,316 | 5/1987 | Hodges | 307/311 |
| 4,754,175 | 6/1988 | Kobayashi et al. | 307/311 |
| 4,755,697 | 7/1988 | Kinzer | 307/311 |
| 4,902,901 | 2/1990 | Pernyeszi | 307/311 |
| 5,013,926 | 5/1991 | Aizawa | 307/311 |

FOREIGN PATENT DOCUMENTS

| | | | |
|---|---|---|---|
| 0177720 | 7/1990 | Japan | 307/311 |
| 0244906 | 9/1990 | Japan | 307/311 |
| 0309811 | 12/1990 | Japan | 307/311 |
| 0065816 | 3/1991 | Japan | 307/311 |

Primary Examiner—Timothy P. Callahan
Assistant Examiner—T. Lam
Attorney, Agent, or Firm—Robert D. Atkins

[57] ABSTRACT

An optically isolated N-channel MOSFET driver turns on a MOSFET device in response to an optical input signal to drive a load. The turn-on time of the MOSFET is enhanced by a current boost circuit. As the MOSFET transcends to an on state and delivers current to the load, the voltage across the device diminishes and causes the current boost circuit to become inactive thus reducing to zero the current drain consumed by the current boost circuit. A photovoltaic array maintains the MOSFET operation. An optically isolated SCR is respondent to the absence of a light signal to turn off the MOSFET. Furthermore, the optical decoupling of the SCR, between the gate and source of the MOSFET device, is arranged to provide enhanced noise immunity. A voltage clamping circuit coupled between the gate and source of the MOSFET device provides additional protection to the device from large over voltages.

16 Claims, 1 Drawing Sheet

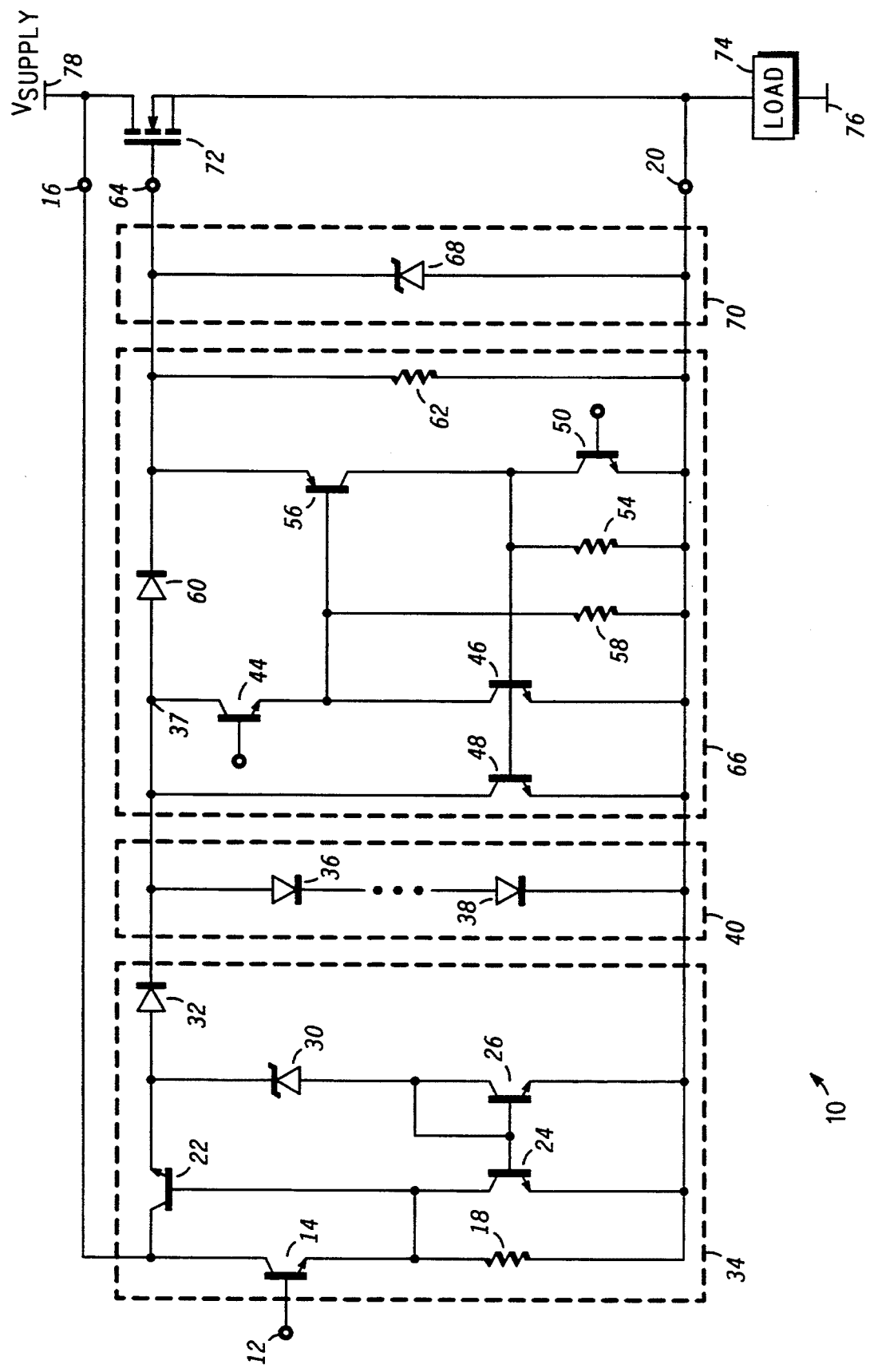

OPTICALLY ISOLATED N-CHANNEL MOSFET DRIVER

BACKGROUND OF THE INVENTION

The present invention relates in general to MOSFET drivers and, more particularly, to an optically isolated N-channel MOSFET driver.

The use of semiconductors in the domain of industrial controls is well established. MOSFET devices used to drive industrial loads must supply large amounts of current to the load, must be capable of withstanding large overvoltage spikes from the load, and must operate at a large supply voltage. To operate in such a hostile environment, the MOSFET device must be large in geometry. As a result, the gate capacitance of the MOSFET is correspondingly large and provides an obstacle to efficiently switching the output state of the device.

In many applications, microprocessors are used as control circuits to MOSFET drivers in order to enhance the controllability of the load. Microprocessors typically operate at supply voltages of 5 volts or less and are therefore very susceptible to noise and extraneous voltage spikes created in a high voltage control circuit environment.

Optical coupling methods have been used to isolate the input of MOSFET drivers from the microprocessor output in an effort to prevent communication of unwanted disturbances therebetween. Typically, the MOSFET driver input includes a photovoltaic array of photosensitive diodes serially connected and driven by a light emitting diode that is controlled by a microprocessor. While a degree of isolation has been achieved, it is well known that the on-switching time of the MOSFET device becomes highly dependent upon the voltage generating characteristics of the photovoltaic array. To extract a large charging voltage from the photovoltaic array, a large number of series connected photosensitive diodes is required. As a consequence, the effective array capacitance increases and degrades the performance of the on-switching time of the device.

A complete industrial control circuit also must have the capability of switching to an off state in an efficient manner while maintaining good noise immunity characteristics. Typical turn off circuits that have been used in the past incorporate an active device, such as a bipolar transistor whose collector-emitter is connected across the gate-source of the MOSFET device. The base of the bipolar transistor is coupled through a resistor to the gate of the MOSFET. A photosensitive diode is connected across the base-emitter junction of the bipolar transistor. The turn off circuit is activated upon removal of a light emitting source. As one skilled in the art would ascertain, several areas of concern now must be considered. The voltage generated across the photosensitive diode cannot be maintained at near zero volts, a condition that is required to prevent the turn off circuit from interfering with the on state of the MOSFET device. A typical diode voltage will be in the range of 0.5 volts and therefore is not capable of completely disabling the transistor to which it is connected. It is obvious that some leakage current flows through the bipolar collector-emitter, robbing gate charge from the MOSFET. It is also known that with the bipolar transistor circuit approach, an RC time constant variable has been introduced that will inherently delay the complete turnoff of the MOSFET device. Attempts have been made to solve this problem by incorporating a silicon controlled rectifier (SCR) in place of the bipolar transistor. While this speeds the discharge of the gate capacitance, the circuit remains prone to false triggering from noise spikes passed from the MOSFET device load to the MOSFET gate coupled via the gate source capacitance.

Hence, a need exists for an efficient optically isolated N-channel MOSFET driver with rapid switching characteristics that is impervious to noise and voltage spikes.

BRIEF DESCRIPTION OF THE DRAWING

The sole figure is a schematic diagram illustrating optically isolated N-channel MOSFET driver.

DETAILED DESCRIPTION OF THE PREFERRED EMBODIMENT

The present invention is an optically isolated n-channel MOSFET driver operating over a wide frequency band down to DC. The MOSFET driver includes also circuitry to protect it from conditions which could result in device failure.

Referring to the sole figure, an optically isolated n-channel MOSFET driver 10 is shown suitable for manufacturing as an integrated circuit using conventional integrated circuit processes. Driver 10 may also be implemented in discrete form. N-channel driver 10 includes a drain terminal 16, a gate terminal 64, and a source terminal 20 coupled to the drain, gate and source of n-channel Metal Oxide Semiconductor Field Effect Transistor (MOSFET) 72, respectively. Load 74 is coupled between the source of MOSFET 72 and power supply conductor 76 operating at ground potential. Alternately, load 74 may be coupled between the drain of transistor 72 and power supply conductor 78 operating at a positive potential $V_{supply}$. Thus, MOSFET driver 10 may control MOSFET 72 as either a high-side switch or a low-side switch. Driver 10 operates down to DC frequency and does not require a separate gate supply when used as a high side switch.

A rapid turn-on circuit 34 includes a photosensitive transistor 14 responsive to an optical input signal applied at input node 12. The collector of transistor 14 is coupled to drain terminal 16 and the emitter of transistor 14 is coupled through resistor 18 to source terminal 20. A current mirror comprising transistors 24 and 26 having their respective emitters coupled to source terminal 20. Current mirror transistor 24 serves to direct current into or away from the base of transistor 22. Current mirror transistor 26 is coupled through a voltage reference diode 30 to provide a reference voltage that is coupled to the emitter of transistor 22. The emitter of transistor 22 is further coupled to diode 32 thus providing a fast turn on current signal at node 37. The fast turn-on current signal at node 37 provides a fast turn-on voltage drive signal (slew rate) through diode 60 to gate terminal 64 that is coupled to the control electrode of MOSFET 72. Turn-on circuit 34 utilizes power from power supply conductor 78 to generate the gate drive to turn on MOSFET 72.

Photovoltaic array 40 includes one or more serially coupled diodes such as diodes 36 and 38 and is responsive to an optical signal that is of corresponding polarity to the signal applied at input node 12 for sustaining the voltage drive through diode 60 to gate terminal 64 to maintain MOSFET 72 in an active state. Photovoltaic array 40 maintains MOSFET 72 operating down to DC (zero frequency).

Rapid turn-off circuit 66 comprises photosensitive transistors 44 and 50 that are responsive to an optical signal of corresponding polarity to that appearing at input node 12 and serve to isolate the turn-off circuit from gate terminal 64 and from source terminal 20 when MOSFET 72 is in an active state. The base of transistor 56 is coupled to the emitter of transistor 44 and to the collector of transistor 46. The base of transistor 56 is also coupled through resistor 58 to source terminal 20. The collector of transistor 56 is coupled to the bases of transistors 46 and 48 and to the collector of transistor 50. The collector of transistor 56 is further coupled through resistor 54 to source terminal 20. Thus, transistors 46 and 56 and resistors 58 and 54 form an SCR switch. The activation of the SCR switch is controlled by transistors 44 and 50, providing a turn-off feature for the MOSFET device at the juncture of the emitter of transistor 56 and gate terminal 64. Diode 60 is connected between node 37 and gate terminal 64 for blocking signals back to node 37. Transistor 48 is coupled between node 37 and source terminal 20 to discharge node 37. Turn-off circuit 66 discharges the gate of MOSFET 72 to turn it off in response to the optical input signal. Thus, either or both of transistors 44 and 50 provide the optically isolated turn-off feature.

A voltage clamping zener diode 68 is coupled between gate terminal 64 and source terminal 20 to protect MOSFET 72 from large over-voltage excursions.

It should be noted that in another embodiment of the invention, photosensitive transistors 14, 44, and 50 could be replaced, in total or individually, by photosensitive diodes. In still another embodiment of the invention, photosensitive transistors 14, 44, and 50 could be replaced, in total or individually, by photosensitive field effect transistors.

The operation of MOSFET driver 10 proceeds as follows. An optical input signal enables optical transistor 14 to conduct current through resistor 18 and supply base current to transistor 22. The base current is beta-multiplied by transistor 22 and flows through diodes 32 and 60 to establish a gate potential at gate terminal 64 to turn on MOSFET 72. With MOSFET 72 conducting, current flows from power supply conductor 78 through load 74 into power supply conductor 76. MOSFET driver 10 is shown as a high-side driver to MOSFET 72. MOSFET driver 10 function equally well as a low-side driver to MOSFET 72. Optical transistor 14 may be implemented as an optical diode or an optical PNP transistor or an optical p-channel FET or n-channel FET.

Turn-on circuit 34 further includes zener diode 30 and current mirror transistors 24 and 26 reduce the gate current to MOSFET 72 once the gate is charged and before the drain-source voltage collapses. As transistor 22 conducts the gate potential to MOSFET 72 begins to rise. When the voltage on the gate of MOSFET 72 plus the two forward potentials of diodes 32 and 60 exceeds the voltage across zener 30, zener 30 begins to conduct current into current mirror transistor 26. Transistor 24 turns on with the same base emitter current density as transistor 26. Transistor 24 may have the same emitter area ratio as transistor 26. The current flowing through transistor 26 is diverted from the base of transistor 22 thus reducing the current through transistor 22 to the gate of MOSFET 72 once the gate of MOSFET 72 becomes charged. As the drain-source voltage of MOSFET 72 collapses, due to the MOSFET turning on, turn-on circuit 34 becomes inoperative.

Photovoltaic array 40 is also supplying current into the gate of MOSFET 72 through diode 60 when optically illuminated. Photovoltaic array 40 includes one or more optical diodes like 36 and 38 serially connected anode to cathode to produce a voltage level and current sufficient to raise the gate potential of MOSFET 72 above its source voltage and turn on and hold on MOSFET 72. This continues even after the drain-source voltage collapses when MOSFET 72 turns on. Photovoltaic array 40 provides a current/voltage source to keep MOSFET 72 conducting after turn-on circuit 34 ceases operation. This provides for operation down to DC frequency. Diode 32 prevents the current and voltage generated by photovoltaic array 40 from being shunted to the source of MOSFET 72.

During optical illumination, the optical input signal is applied to the gates of optical transistors 44 and 50. Optical transistors 44 and 50 may be implemented as an optical diode or an optical PNP transistor or an optical p-channel or n-channel FET. Transistor 44 shunts the base-emitter junction of transistor 56 turning it off. Likewise, transistor 50 shunts the base-emitter junction of transistors 46 and 48 turning both off. Turn-off circuit 66 is thus disabled.

Once MOSFET 72 is conducting, over-voltage protection circuit 70 comprising one or more zener diodes 68 are connected across the gate-source junction of MOSFET 72 for providing protection from over voltage conditions by providing a low impedance path from the gate to source once the zener voltage is exceeded. Zener 68 drains off any accumulated charge in excess of the zener voltage.

When the optical input signal is removed, MOSFET driver 10 turns off MOSFET 72 by shunting its gate to the source. Transistor 14 reverts to a non-conductive state to keep turn-on circuit 34 from delivering any current to the gate of MOSFET 72 as its drain-source voltage begins to rise. Photovoltaic array 40 ceases to operate and supplies no more current and voltage to the gate of MOSFET 72 when optical illumination is removed.

When optical illumination is removed, turn-off circuit 66 shunts the gate of MOSFET 72 to its source to turn MOSFET 72 off. Optical transistors 44 and 50 turn off without the optical input signal. This removes the base-emitter shunts from transistors 5, 46, and 48. When the base-emitter shunts are removed, the gate of MOSFET 72 provides a voltage to forward bias the base-emitter junction of transistor 56 through resistor 58. Transistor 56 turns on. The collector current of transistor 56 turns on transistors 46 and 48 by delivering current to their bases. The collector of transistor 48 is coupled to node 37 to discharges the stored charge in to photovoltaic array 40. The collector of transistor 46 is connected to the base of transistor 56 to provide a regenerative action to keep transistors 56, 46, and 48 conducting. The gate of MOSFET 72 is shunted to its source until the gate-source voltage falls below the SCR hold-in-voltage. Resistor 62 shunts the gate-source voltage of MOSFET 72 from the SCR hold-in-voltage to zero volts. Resistor 54 reduces the sensitivity of the SCR to noise induced false triggering.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A MOSFET driver having a gate output terminal, a drain output terminal and a source output terminal, comprising:
   a photovoltaic array coupled between a first node and the source output terminal and operating in response to an optical input signal for developing a gate voltage at the gate output terminal;
   first means responsive to said optical input signal for sourcing current into said first node to increase slew rate of said gate voltage at the gate output terminal, said first mean including,
   (a) first optical switching means having first and second conduction terminals and a control terminal, said first conduction terminal being coupled to the drain output terminal, said control terminal receiving said optical input signal,
   (b) a first resistor coupled between said second conduction terminal of said first optical switching means and the source output terminal,
   (c) a first transistor having a base, an emitter and a collector, said collector being coupled to said first conduction terminal of said first optical switching means,
   (d) a current mirror circuit having an input and an output, said output being coupled to said second conduction terminal of said first optical switching means and to said base of said first transistor,
   (e) a first diode having cathode coupled to said emitter of said first transistor and having an anode coupled to said input of said current mirror circuit, and
   (f) a second diode having an anode coupled to said emitter of said first transistor and having a cathode coupled to said first node; and
   second means responsive to an absence of said optical input signal for discharging said gate voltage at the gate output terminal.

2. The MOSFET driver of claim 1 further including third means for clamping said gate voltage upon detecting an over-voltage condition.

3. The MOSFET driver of claim 2 wherein said third means includes a zener diode having a cathode coupled to the gate output terminal and having an anode coupled to the source output terminal.

4. (Amended) The MOSFET driver of claim 1 wherein said photovoltaic array includes:
   a third diode having an anode coupled to said first node and having a cathode; and
   a fourth diode having an anode coupled to said cathode of said third diode and having a cathode coupled to the source output terminal.

5. The MOSFET driver of claim 1 wherein said first optical switching means includes a second transistor having a base, an emitter and a collector, said base receiving said optical input signal, said collector being coupled to said first conduction terminal of said first optical switching means, said emitter being coupled to said second conduction terminal of said first optical switching means.

6. The MOSFET driver of claim 5 wherein said current mirror circuit includes:
   a third transistor having a base, an emitter and a collector, said collector being coupled to said base of said first transistor, said emitter being coupled to the source output terminal; and
   a fourth transistor having a base, an emitter and a collector, said collector being coupled to said bases of said third and fourth transistor and to said anode of said first diode, said emitter being coupled to the source output terminal.

7. The MOSFET driver of claim 1 wherein said second means includes:
   second optical switching means having first and second conduction terminals and a control terminal, said first conduction terminal being coupled to said first node, said control terminal receiving said optical input signal;
   a third diode having an anode coupled to said first node and having a cathode coupled to the gate output terminal;
   a second transistor having a base, an emitter and a collector, said emitter being coupled to the gate output terminal;
   a second resistor coupled between said collector of said second transistor and the source output terminal; and
   a third transistor having a base, an emitter and a collector, said collector being coupled to said second conduction terminal of said second optical switching means and to said base of said transistor, said base being coupled to said collector of said second transistor, said emitter being coupled to the source output terminal.

8. The MOSFET driver of claim 7 wherein said second means further includes:
   third optical switching means having first and second conduction terminals and a control terminal, said first conduction terminal being coupled to said collector of said second transistor, said control terminal receiving said optical input signal, said second conduction terminal being coupled to the source output terminal;
   a fourth transistor having a base, an emitter and a collector, said collector being coupled to said first node, said emitter being coupled to the source output terminal, said base being coupled to said collector of said second transistor;
   a third resistor coupled between said base of said second transistor and the source output terminal; and
   a resistor coupled between the gate output terminal and the source output terminal.

9. The MOSFET driver of claim 8 wherein said second optical switching means includes a fifth transistor having a base, an emitter and a collector, said base receiving said optical input signal, said collector being coupled to said first conduction terminal of said second optical switching means, said emitter being coupled to said second conduction terminal of said second optical switching means.

10. The MOSFET driver of claim 9 wherein said third optical switching means includes a sixth transistor having a base, an emitter and a collector, said base receiving said optical input signal, said collector being coupled to said first conduction terminal of said third optical switching means, said emitter being coupled to said second conduction terminal of said third optical switching means.

11. A MOSFET driver having a gate output terminal, a drain output terminal and a source output terminal, comprising:
   a photovoltaic array coupled between a first node and the source output terminal and operating in response to an optical input signal for developing a gate voltage at the gate output terminal;

a first diode having an anode coupled to said first node and having a cathode coupled to the gate output terminal;

first optical switching means having first and second conduction terminals and a control terminal, said first conduction terminal being coupled to said first node, said control terminal receiving said optical input signal;

a first transistor having a base, an emitter and a collector, said emitter being coupled to the gate output terminal;

a second transistor having a base, an emitter and a collector, said collector being coupled to said second conduction terminal of said first optical switching means and to said base of said first transistor, said base being coupled to said collector of said first transistor, said emitter being coupled to the source output terminal;

a first resistor coupled between said collector of said first transistor and the source output terminal;

second optical switching means having first and second conduction terminals and a control terminal, said first conduction terminal being coupled to said collector of said first transistor, said control terminal receiving said optical input signal, said second conduction terminal being coupled to the source output terminal;

a third transistor having a base, an emitter and a collector, said collector being coupled to said first node, said emitter being coupled to the source output terminal, said base being coupled to said collector of said first transistor;

a second resistor coupled between said base of said first transistor and the source output terminal; and a third resistor coupled between the gate output terminal and the source output terminal.

12. The MOSFET driver of claim 11 wherein said first optical switching means includes a fourth transistor having a base, an emitter and a collector, said base receiving said optical input signal, said collector being coupled to said first conduction terminal of said first optical switching means, said emitter being coupled to said second conduction terminal of said first optical switching means.

13. The MOSFET driver of claim 11 wherein said second optical switching means includes a fifth transistor having a base, an emitter and a collector, said base receiving said optical input signal, said collector being coupled to said first conduction terminal of said second optical switching means, said emitter being coupled to said second conduction terminal of said second optical switching means.

14. A MOSFET driver having a gate output terminal, a drain output terminal and a source output terminal, comprising:

a photovoltaic array coupled between a first node and the source output terminal and operating in response to an optical input signal for developing a gate voltage at the gate output terminal;

a first diode having an anode coupled to said first node an having a cathode coupled to the gate output terminal;

a first transistor having a base, an emitter and a collector, said emitter being coupled to the gate output terminal;

first optical switching means having first and second conduction terminals and a control terminal said first conduction terminal being coupled to said collector of said first transistor, said control terminal receiving said optical input signal, said second conduction terminal being coupled to the source output terminal;

a second transistor having a base an emitter and a collector, said collector being coupled to said base of said first transistor, said base being coupled to said collector of said first transistor, said emitter being coupled to the source output terminal;

second optical switching means having first and second conduction terminals and a control terminal, said first conduction terminal being coupled to said first node, said control terminal receiving said optical input signal, said second conduction terminal being coupled to said collector of said second transistor;

a first resistor coupled between said collector of said first transistor and the source output terminal;

a third transistor having a base, an emitter and a collector, said collector being coupled to said first node, said emitter being coupled to the source output terminal, said base being coupled to said collector of said first transistor;

a second resistor coupled between said base of said first transistor and the source output terminal; and a third resistor coupled between the gate output terminal and the source output terminal.

15. The MOSFET driver of claim 14 wherein said first optical switching means includes a fourth transistor having a base, an emitter and a collector, said base receiving said optical input signal, said collector being coupled to said first conduction terminal of said first optical switching means, said emitter being coupled to said second conduction terminal of said first optical switching means.

16. The MOSFET driver of claim 15 wherein said second optical switching means includes a fifth transistor having a base, an emitter and a collector, said base receiving said optical input signal, said collector being coupled to said first conduction terminal of said second optical switching means, said emitter being coupled to said second conduction terminal of said second optical switching means.

* * * * *

UNITED STATES PATENT AND TRADEMARK OFFICE
CERTIFICATE OF CORRECTION

PATENT NO. : 5,391,997
DATED : February 21, 1995
INVENTOR(S) : Brian D. Meyer et al.

It is certified that error appears in the above-indentified patent and that said Letters Patent is hereby corrected as shown below:

In column 6, line 3, claim 6, delete "transistor" and insert therefor --transistors--.

In column 6, line 46, claim 8, after "a" insert therefor--fourth--.

In column 8, line 6, claim 14, delete "an" and insert therefor --and--.

Signed and Sealed this

Twenty-eighth Day of November 1995

Attest:

BRUCE LEHMAN

*Attesting Officer*  *Commissioner of Patents and Trademarks*